United States Patent
Lee et al.

(10) Patent No.: US 9,496,015 B1
(45) Date of Patent: Nov. 15, 2016

(54) ARRAY STRUCTURE HAVING LOCAL DECODERS IN AN ELECTRONIC DEVICE

(71) Applicant: MACRONIX INTERNATIONAL CO., LTD., Hsinchu (TW)

(72) Inventors: Ming-Hsiu Lee, Hsinchu (TW); Chun-Hsiung Hung, Hsinchu (TW); Tien-Yen Wang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/822,941

(22) Filed: Aug. 11, 2015

(51) Int. Cl.
*G11C 11/34* (2006.01)
*G11C 8/10* (2006.01)
*G11C 8/12* (2006.01)
*G11C 8/14* (2006.01)

(52) U.S. Cl.
CPC . *G11C 8/10* (2013.01); *G11C 8/12* (2013.01); *G11C 8/14* (2013.01)

(58) Field of Classification Search
USPC ............ 365/185.05, 185.18, 185.23, 230.03, 365/230.06, 185.17
See application file for complete search history.

(56) References Cited

U.S. PATENT DOCUMENTS

| | | | | |
|---|---|---|---|---|
| 7,149,115 B2* | 12/2006 | Ogura | ........................ | G11C 7/06 365/185.23 |
| 7,245,530 B2* | 7/2007 | Ichikawa | ........... | G11C 16/0433 365/185.05 |
| 7,428,161 B2* | 9/2008 | Kanda | .................... | G11C 16/24 365/185.05 |
| 7,518,921 B2* | 4/2009 | Maejima | ............. | H01L 27/0203 365/185.23 |
| 7,940,563 B2* | 5/2011 | Yokoi | ........................ | G11O 5/02 365/185.05 |
| 8,289,777 B2* | 10/2012 | Mawatari | ........... | G11C 16/0433 365/185.18 |
| 8,514,632 B2* | 8/2013 | Takahashi | .......... | G11C 16/0433 365/185.23 |

* cited by examiner

*Primary Examiner* — Trong Phan
(74) *Attorney, Agent, or Firm* — McClure, Qualey & Rodack, LLP

(57) ABSTRACT

An array structure includes: a plurality of first signal lines and a plurality of sub-arrays. Each of the sub-array includes: a second signal line, a plurality of third signal lines, a plurality of fourth signal lines, a plurality of local decoders at each intersection of the first signal lines, the second signal line and the third signal lines; and a plurality of array cells at each intersection of the first signal lines, the third signal lines and the fourth signal lines. Respective control terminals of the local decoders are implemented by the first signal lines. In response to a selection status of the first signal lines and the second signal line, one of the local decoders selects one of the third signal lines.

11 Claims, 4 Drawing Sheets

ARRAY STRUCTURE HAVING LOCAL DECODERS IN AN ELECTRONIC DEVICE

TECHNICAL FIELD

The disclosure relates in general to an array structure having local decoders.

BACKGROUND

An array structure, for example, a memory array in a memory device, usually includes a plurality of array cells, a plurality of bit lines, a plurality of source lines and a plurality of word lines. The array cells, for example, memory cells, may be located at intersections of the word lines and the bit lines.

One of the efforts relies on how to perform decoding/selection on the array structure by a simple circuit structure, to reduce circuit size and RC delays.

SUMMARY

The disclosure is directed to an array structure having local decoders. When the corresponding word line is selected, the corresponding local decoder is also selected. Thus, no additional decoding control/selection circuit is required.

According to one embodiment, an array structure is provided. The array structure includes a plurality of first signal lines and a plurality of sub-arrays sharing the first signal lines. Each of the sub-array includes: a second signal line, a plurality of third signal lines, a plurality of fourth signal lines, a plurality of local decoders at each intersection of the first signal lines, the second signal line and the third signal lines, and a plurality of array cells at each intersection of the first signal lines, the third signal lines and the fourth signal lines. Respective control terminals of the local decoders are implemented by the first signal lines, and in response to a selection status of the first signal lines and the second signal line, one of the local decoders selects one of the third signal lines.

According to another embodiment, an array structure is provided. The array structure includes: a plurality of first signal lines, each passing through the array structure in a first direction; a plurality of second signal lines, each passing through the array structure in a second direction; a plurality of third signal lines, each along the first direction but not passing through the array structure; a plurality of fourth signal lines, along the second direction; a plurality of local decoders at each intersection of the first signal lines, the second signal lines and the third signal lines, and a plurality of array cells at each intersection of the first signal lines, the third signal lines and the fourth signal lines. The first signal lines control whether the local decoders are conducted, and the local decoders decode a voltage application on the first signal lines and the second signal lines to select one of the third signal lines.

Figure 1:
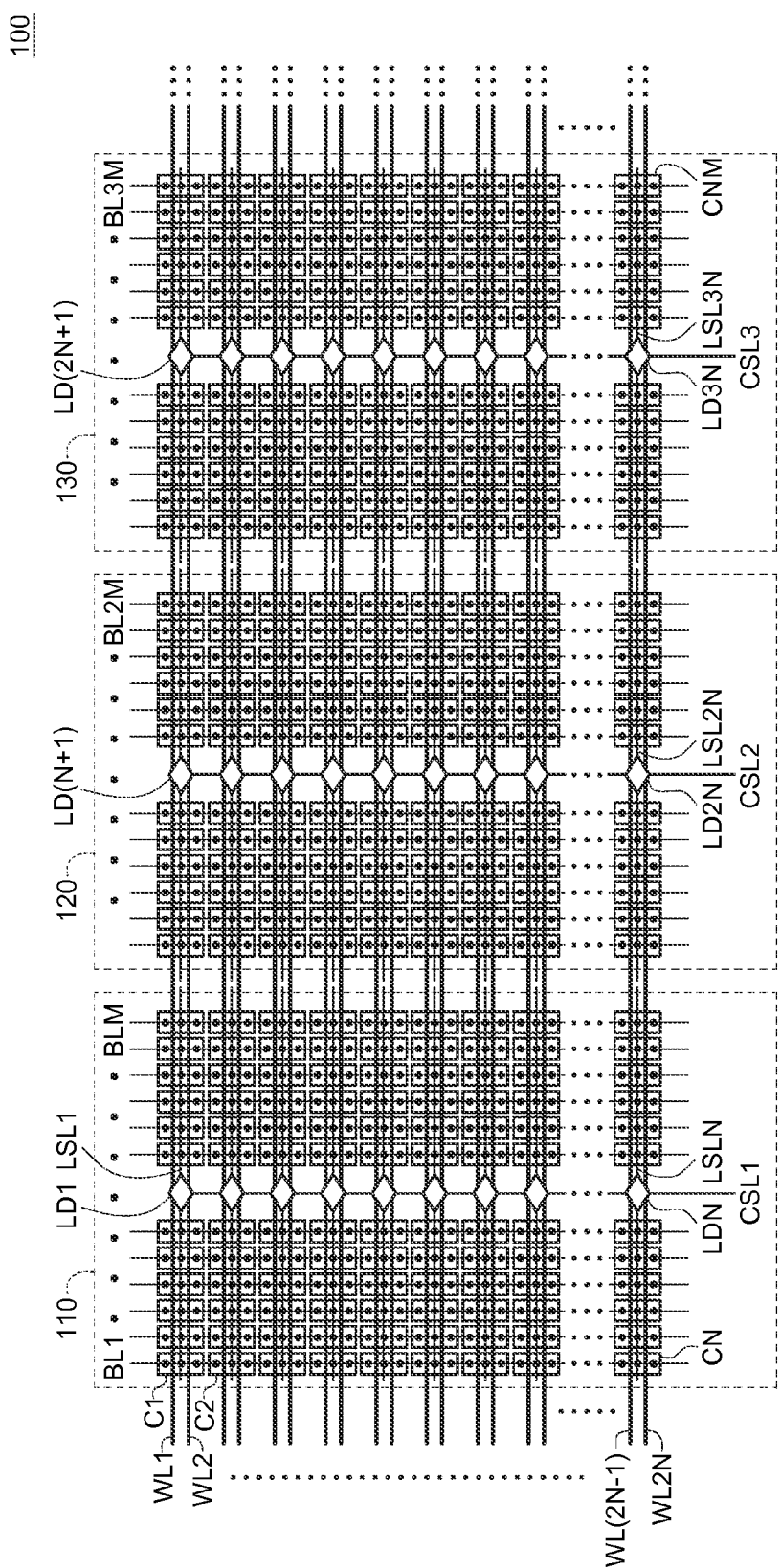
FIG. 1 shows an array structure according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure.

FIG. 1 shows an array structure according to an embodiment of the disclosure. As shown in FIG. 1, the array structure 100 includes a plurality of array cells C1-CNM (N and M both being natural number), a plurality of common source lines CSL1-CSL3, a plurality of word lines WL1-WL2N, a plurality of local source lines LSL1-LSL3N, a plurality of local decoders LD1-LD3N and a plurality of bit lines BL1-BL3M.

The array cells are at intersections of the bit lines and the word lines. For example, the array cell C1 is at an intersection of the bit line BL1 and the word lines WL1-WL2.

The bit lines BL1-BL3M pass through the array structure 100 along a vertical direction of FIG. 1, and the word lines WL1-WL2N pass through the array structure 100 along a horizontal direction of FIG. 1. Besides, the local source lines LSL1-LSL3N pass through the corresponding sub-arrays but does not pass through the array structure 100. For example, the local source line LSL1 passes through the first sub-array 110, the local source line LSLN+1 passes through the second sub-array 120, and the local source line LSL2N+1 passes through the third sub-array 130. The local source line LSL1 is disconnected from the local source lines LSLN+1 and LSL2N+1.

Although in FIG. 1, the array structure 100 includes three sub-arrays 110-130, the disclosure is not limited thereby. The array structure 100 may include more or fewer sub-arrays, which is still within the scope of the disclosure.

The word lines WL1-WL2N are shared by the sub-arrays 110-130, and each sub-array includes a common source lines, a plurality of local decoders, a plurality of local source lines, a plurality of bit lines and a plurality of array cells.

The local decoders are at intersections of the common source lines, the word lines and the local source lines. For example, the local decoder LD1 is at an intersection of the common source line CLS1, the word lines WL1-WL2 and the local source line LSL1.

Figure 2A:
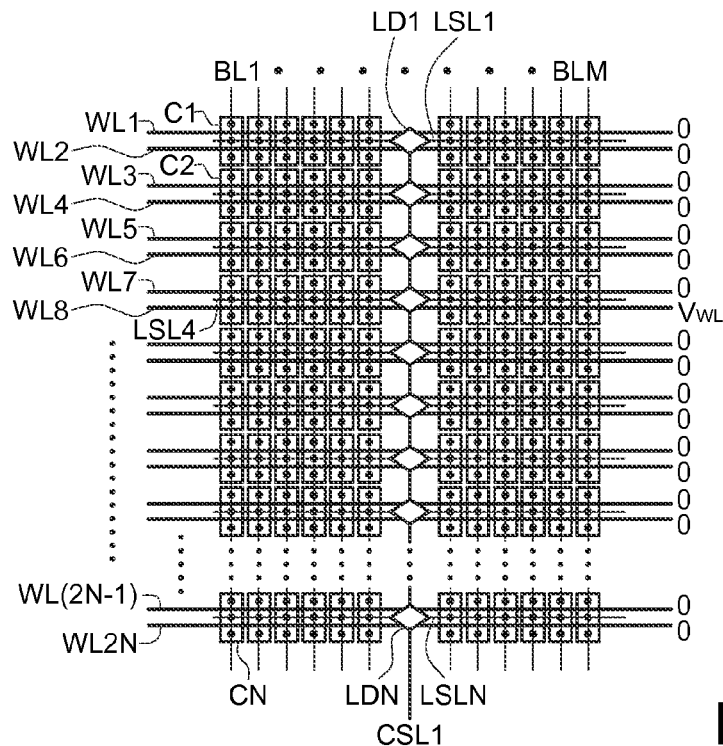
FIGS. 2A-2B show decoding/selection of a sub-array of the array structure according to the embodiment of the disclosure.
Figure 2B:
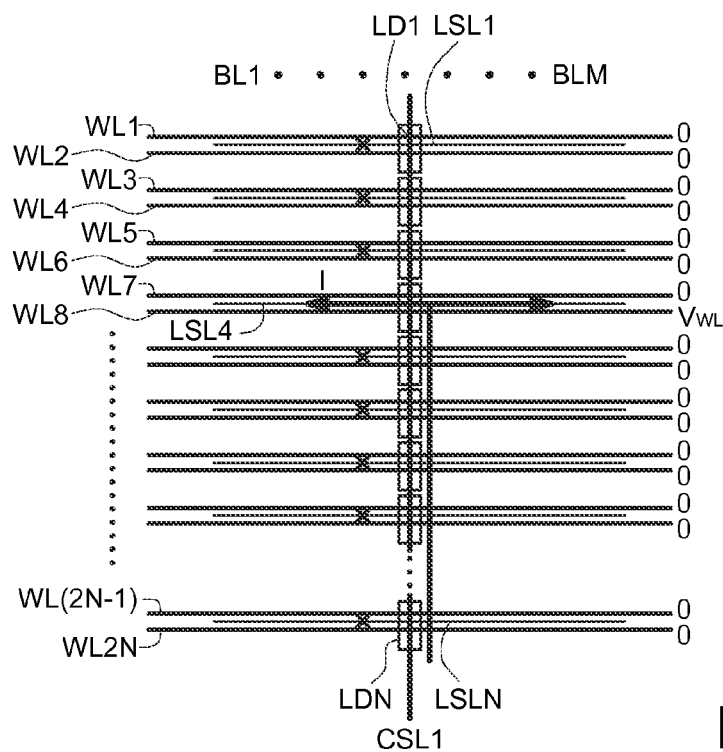

FIGS. 2A-2B show decoding/selection of a sub-array of the array structure according to the embodiment of the disclosure. Decoding/selection of the first sub-array 110 is taken as an example. As shown in FIG. 2A, in selecting the array cells (for example the memory cells) on the word line WL8, the word line WL8 is applied by a word line voltage $V_{WL}$, other word lines are applied by 0V and the corresponding common source line CSL1 is applied by a high voltage VS. The bias arrangement will conduct (i.e. turn on)

the local decoder related to the word line WL8 and thus, the current I flows from the common source line CSL1 to the corresponding local source line LSL4 via the local decoder, as shown in FIG. 2B.

Figure 3A:
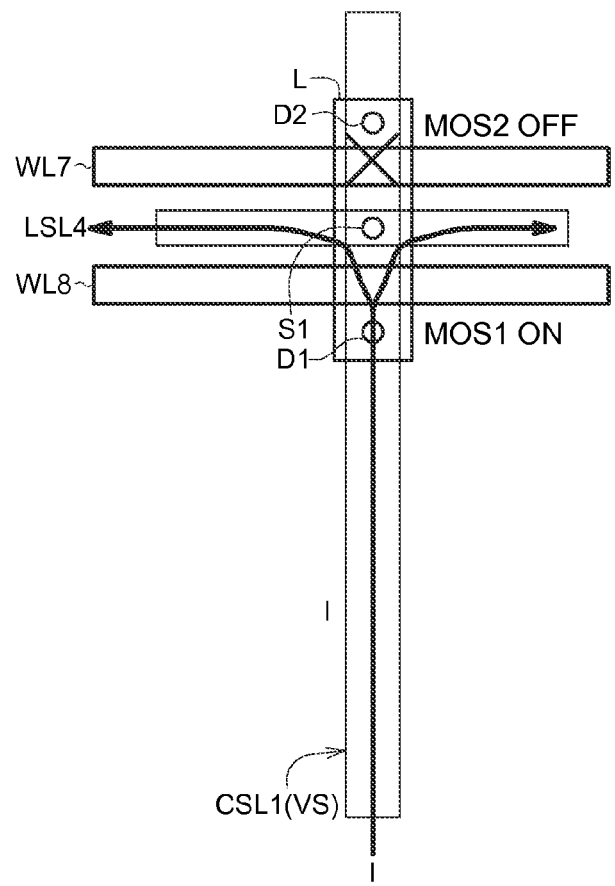
FIGS. 3A-3B show a layout diagram and an equivalent circuit diagram of the local decoder according to the embodiment of the disclosure.
Figure 3B:
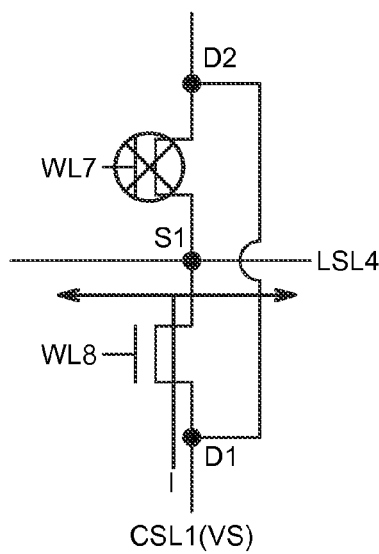

FIGS. 3A-3B show a layout diagram and an equivalent circuit diagram of the local decoder according to the embodiment of the disclosure. As shown in FIG. 3A, the local decoder includes two switches (for example but not limited by transistors). For simplification, the local decoder includes two transistors MOS1 and MOS2. The gate of the transistor MOS1 is formed by the word line (for example, the word line WL8), and the gate of the transistor MOS2 is formed by another word line (for example, the word line WL7). That is, in manufacturing, the word line and the gate of the transistor of the local decoder are made in the same manufacturing process. In other words, the word line is used as the gate (i.e. the control terminal) of the transistor of the local decoder. The drain contact D1 of the transistor MOS1 is electrically connected to the common source line (for example, CSL1), and the drain contact D2 of the transistor MOS2 is electrically connected to the same common source line (for example, CSL1). That is, via the common source line, the drain contact D1 of the transistor MOS1 is electrically connected to the drain contact D2 of the transistor MOS2. The transistors MOS1 and MOS2 share the source contact S1. The common source contact S1 of the transistors MOS1 and MOS2 is electrically connected to the local source line (for example, LSL4). The reference symbol "L" refers to a diffusion region of the transistors MOS1 and MOS2.

The common source lines are formed by, for example but not limited to, metal lines or diffusion layers (for example, N+Si diffusion layer). The local source lines are formed by, for example but not limited to, metal lines or diffusion layers.

If the common source lines and the local source lines are implemented by the metal lines, in possible layout, the common source lines and the local source lines may be on the first metal layer and the second metal layer, respectively. If needed, other metal layers may be used for routing purpose.

The operations of the local decoder are described as follows. As shown in FIGS. 3A and 3B, because the common source line CSL1 is applied by the high voltage VS and the word line WL8 are also applied by the high voltage $V_{WL}$, the transistor MOS1 is conducted (MOS1 ON). On the other hand, because the common source line CSL1 is applied by the high voltage VS and the word line WL7 are also applied by 0V, the transistor MOS2 is turned off (MOS2 OFF). Because the transistor MOS1 is conducted, the current I flows from the common source line CSL1 to the local source line LSL4. If the word line is selected, then the corresponding local decoder is selected to select the corresponding local source line. In the embodiment of the disclosure, the local source line and the array cells on the local source line may be selected via the local decoder and thus no additional control/selection/decoding circuit is required. Thus, the embodiment of the disclosure has advantages of smaller circuit size and simple circuit configuration.

Figure 4A:
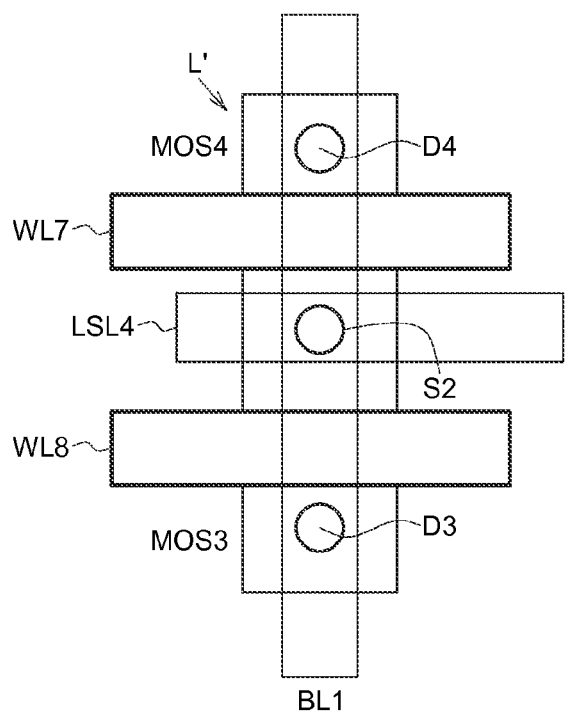
FIGS. 4A-4B show a layout diagram and an equivalent circuit diagram of the array cell according to the embodiment of the disclosure.
Figure 4B:
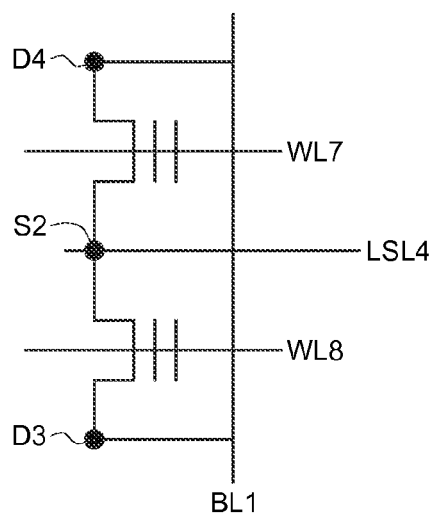

FIGS. 4A-4B show a layout diagram and an equivalent circuit diagram of the array cell according to the embodiment of the disclosure. For simplicity, in FIGS. 4A-4B, the array cell on the word lines WL7-WL8 is taken as an example. As shown in FIGS. 4A-4B, the array cell includes two switches which are for example but not limited by two transistors MOS3 and MOS4. The gate (the control terminal) of the transistor MOS3 is the word line (for example WL8), and the gate (the control terminal) of the transistor MOS4 is the word line (for example WL7). That is, during manufacturing, the word line and the gate of the transistor of the array cell are manufactured in the same process. Thus, the word line may be used as the gate of the transistor of the array cell. The drain contact D3 of the transistor MOS3 is electrically connected to the bit line (for example, BL1), and the drain contact D4 of the transistor MOS4 is electrically connected to the same bit line (for example, BL1). That is, via the bit line, the drain contact D3 of the transistor MOS3 is electrically connected to the drain contact D4 of the transistor MOS4. The transistors MOS3 and MOS4 share the common source contact S2, which is electrically connected to the local source line (for example LSL4). The source contact S2, the drain contacts D3 and D4 are formed on the diffusion layer L'.

The source contact S2 of the array cell is electrically connected to the diffusion layer L' and the local source line, and the drain contacts D3 and D4 are electrically connected to the diffusion layer L' and the bit line.

Operations of the array cell are as follows. As shown in FIGS. 4A and 4B, if the selected array cell is to be reset or read, the selected common source line (for example, CSL1) is applied by 0V (and unselected common source lines CSL2 and CSL3 are also applied by 0V), the selected bit line BL1 is applied by the high voltage (but the unselected bit lines are applied by 0V) and the selected word line WL8 is applied by the high voltage $V_{WL}$. Thus, the transistor MOS3 is turned on. On the other hand, the selected bit line BL1 is applied by the high voltage and the unselected word line WL7 is applied by 0V. Thus, the transistor MOS4 is turned off. Via the voltage bias arrangement, the transistor MOS3 at the intersection of the word line WL8 and the bit line BL1 is selected.

In set operation (in which the current flows from the local source line to the bit line in a reverse direction), the selected common source line CSL1 is applied by the high voltage VS (but the unselected common source lines CSL2 and CSL3 are applied by 0V), and the selected bit line BL1 is applied by 0V (but the unselected bit lines on the same sub-array 110 as the selected common source line CSL1 are applied by the high voltage VS), to prevent the transistors on the unselected bit lines from being turned on. The bit lines of the unselected sub-arrays (for example, the sub-arrays 120 and 130 in which the unselected common source lines CSL2 and CSL3 are located) are applied by 0V. The selected word line WL8 is also applied by the high voltage $V_{WL}$ to turn on the transistor MOS3. The selected bit line BL1 is applied by 0V but the unselected word line WL7 is applied by 0V, to turn off the transistor MOS4. By the bias voltage arrangement, the transistor MOS3 at the intersection of the word line WL8 and the bit line BL1 is selected and the current flows from the local source line to the bit line in a reverse direction in the set operation.

In the embodiment of the disclosure, if the local decoders and the array cells are formed in twin cell layout, the circuit area is reduced because the twin cell layout may share the common source contact.

In the embodiment of the disclosure, because the source lines are partitioned into a plurality of shorter local source lines, the resistance of the local source lines is lower and thus RC delay is reduced. Besides, because the resistance of the local source lines is lower, the voltage drop on the local source lines is also lower and thus the body effect is reduced. Thus, the negative effect on the gate-source voltage VGS of the transistor is less and thus the negative on the conduction current of the transistor is also less.

In the embodiment of the disclosure, a plurality of array cells share the same local decoder, and thus the number of the local decoders is fewer. The circuit area and the circuit cost are reduced.

In the embodiment of the disclosure, the effective capacitance of the local source lines is also lower to further reduce RC delay problem.

In current technology, in the set operation in which the current flows from the source lines passing through the entire array structure to the bit lines in a reverse direction, the selected bit line is applied by 0V and other unselected bit lines are applied by high voltage to prevent the transistors on the unselected bit lines from being turned on. The total leakage current from the unselected transistors is large.

On the contrary, in the embodiment of the disclosure, the entire array structure is partitioned into several sub-arrays. In the set operation in which the current flows from the (local) source lines to the bit lines in a reverse direction, the common source line of the selected sub-array is applied by the high voltage while the common source lines of the unselected sub-arrays are applied by 0V. The selected bit line of the selected sub-array is applied by 0V, and the unselected bit lines of the selected sub-array are applied by high voltage. But the bit lines of the unselected sub-arrays are applied by 0V. That is to say, the number of the unselected bit lines applied by high voltage in the embodiment of the disclosure is about ⅓ of the number of the unselected bit lines applied by high voltage in the current technology (if one array structure is partitioned into three sub-arrays). Thus, in the embodiment of the disclosure, the total leakage current from the unselected transistors is reduced (for example as ⅓ of that of the current technology). Therefore, the embodiment of the disclosure may effectively reduce the leakage current and power consumption.

In an embodiment of the disclosure, if the array structure is applied in a memory device, the array structure may be for example but not limited by a NOR type memory array and the array cells may be for example but not limited by, floating-gate memory cells, charging trapping memory cells, ferroelectric memory cells, and resistance change memory cells (for example, phase change memory cells, resistive memory cells and magnetic memory cells).

In the embodiment of the disclosure, the transistors in the array cells may be for example but not limited by, NMOS transistors, PMOS transistors, NPN BJT (Bipolar Junction Transistor) transistor, PNP BJT transistors or the like.

Although the above embodiment of the disclosure is described as being applied in the memory device, the disclosure is not limited by this. The disclosure may be applied in the suitable application which having array structure. For example, the array structure of the embodiment of the disclosure may be applied in a light sensor array which is used in the image processing. When applied in the light sensor array, the light sensors may be used as the array cells and a plurality of light sensors are arranged in an array. The local decoders are used to select the light sensors to be read. The details are as above description and thus are omitted for simplification. This is also within the scope of the disclosure.

In other possible embodiment of the disclosure, the array structure may be used as a light source array structure and the light source cells may be used as the array cells. The local decoders are used to select the light source cells for light emission. The details are as above description and thus are omitted for simplification. This is also within the scope of the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An array structure includes:
a plurality of first signal lines and
a plurality of sub-arrays, sharing the first signal lines, each of the sub-array including:
a second signal line,
a plurality of third signal lines,
a plurality of fourth signal lines,
a plurality of local decoders at each intersection of the first signal lines, the second signal line and the third signal lines, wherein each of the local decoders are shared by at least two of the first signal lines, and
a plurality of array cells at each intersection of the first signal lines, the third signal lines and the fourth signal lines;
wherein the first signal lines function as respective control terminals of the local decoders, and
by controlling signals applied to the first signal lines and by controlling signal applied to the second signal line, one of the local decoders is controlled to select one of the third signal lines.

2. The array structure according to claim 1, wherein
the first signal lines are a plurality of word lines passing through the array structure;
the second signal line is a common source line;
the third signal lines are a plurality of local source lines; and
the fourth signal lines are a plurality of bit lines.

3. The array structure according to claim 1, wherein
in response to one first signal line of the first signal lines and the second signal line are both selected, a corresponding local decoder of the local decoders is conducted to select the selected third signal line.

4. The array structure according to claim 1, wherein
each local decoder includes a plurality of switches, the switches sharing a first contact, each switch at an intersection of the second signal line and a corresponding first signal line of the first signal lines; and
in response to one of the first signal lines is selected, a corresponding switch of the switches is conducted while other switch are turned off, to conduct a current from the selected second signal line to the selected third signal line of the third signal lines.

5. The array structure according to claim 4, wherein
each switch includes the first contact, a second contact and the control terminal, the second contact electrically connected to the second signal line;
the second contacts of the switches connect to each other via the second signal line; and
the first contact is electrically connected to a corresponding third signal line of the third signal lines.

6. The array structure according to claim 1, wherein
the second signal line is formed by a metal line or a diffusion layer; and
each of the third signal lines is formed by a metal line or a diffusion layer.

7. An array structure includes:
a plurality of first signal lines, each passing through the array structure in a first direction;
a plurality of second signal lines, each passing through the array structure in a second direction;

a plurality of third signal lines, each along the first direction and extending through a part of the array structure;

a plurality of fourth signal lines, along the second direction;

a plurality of local decoders at each intersection of the first signal lines, the second signal lines and the third signal lines, wherein each of the local decoders are shared by at least two of the first signal lines, and a plurality of array cells at each intersection of the first signal lines, the third signal lines and the fourth signal lines;

wherein the first signal lines control whether the local decoders are conducted, and the local decoders decode a voltage applied on the first signal lines and the second signal lines to select one of the third signal lines.

8. The array structure according to claim 7, wherein the first signal lines form respective control terminals of the local decoders;

the first signal lines are a plurality of word lines;

the second signal lines are a plurality of common source lines;

the third signal lines are a plurality of local source lines; and the fourth signal lines are a plurality of bit lines.

9. The array structure according to claim 7, wherein in response to one first signal line of the first signal lines and one second signal line of the second signal lines are both selected, a corresponding local decoder of the local decoders is conducted to select the selected third signal line.

10. The array structure according to claim 7, wherein each local decoder includes a plurality of switches, the switches sharing a first contact, each switch at an intersection of a corresponding second signal line of the second signal lines and a corresponding first signal line of the first signal lines; and in response to one of the first signal lines is selected, a corresponding switch, coupled to the selected first signal line, of the switches is conducted while other switch are turned off, to conduct a current from the selected second signal line to the selected third signal line of the third signal lines.

11. The array structure according to claim 10, wherein each switch includes the first contact, a second contact and the control terminal, the second contact electrically connected to the second signal line;

the second contacts of the switches connect to each other via the second signal line; and the first contact is electrically connected to a corresponding third signal line of the third signal lines.

* * * * *